(12) United States Patent
Choi

(10) Patent No.: US 10,867,571 B2
(45) Date of Patent: Dec. 15, 2020

(54) PANEL DRIVING INTEGRATED CIRCUIT, DISPLAY DEVICE AND INTEGRATED CIRCUIT

(71) Applicant: SILICON WORKS CO., LTD., Daejeon (KR)

(72) Inventor: Jung Min Choi, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 137 days.

(21) Appl. No.: 16/133,060

(22) Filed: Sep. 17, 2018

(65) Prior Publication Data

US 2019/0103069 A1 Apr. 4, 2019

(30) Foreign Application Priority Data

Sep. 29, 2017 (KR) .................. 10-2017-0127003

(51) Int. Cl.
| | | |
|---|---|---|
| G09G 3/30 | (2006.01) | |
| G09G 3/36 | (2006.01) | |
| G06F 3/041 | (2006.01) | |
| G06F 3/044 | (2006.01) | |
| G02F 1/1333 | (2006.01) | |
| H01L 51/52 | (2006.01) | |
| G09G 3/20 | (2006.01) | |
| H01L 27/32 | (2006.01) | |

(52) U.S. Cl.
CPC ....... *G09G 3/3688* (2013.01); *G02F 1/13338* (2013.01); *G06F 3/044* (2013.01); *G06F 3/0412* (2013.01); *G06F 3/0416* (2013.01); *G06F 3/0443* (2019.05); *G06F 3/04184* (2019.05); *G09G 3/2092* (2013.01); *G09G 3/3677* (2013.01); *H01L 51/5221* (2013.01); *G09G 2300/0408* (2013.01); *G09G 2300/0426* (2013.01); *G09G 2300/0871* (2013.01); *G09G 2310/027* (2013.01); *G09G 2310/0289* (2013.01); *G09G 2310/08* (2013.01); *G09G 2330/021* (2013.01); *G09G 2354/00* (2013.01); *H01L 27/323* (2013.01)

(58) Field of Classification Search
CPC ...... G06F 1/1643; G06F 1/169; G06F 1/1692; G06F 3/03547; G06F 3/041; G06F 3/0428; G09G 3/30–32961; G09G 3/34–38; G09G 2310/0264–0297
See application file for complete search history.

(56) References Cited

U.S. PATENT DOCUMENTS

| | | |
|---|---|---|
| 9,778,713 B2 | 10/2017 | Reynolds et al. |
| 2016/0196000 A1 | 7/2016 | Reynolds et al. |
| 2016/0196803 A1 | 7/2016 | Reynolds et al. |
| 2017/0003779 A1 | 1/2017 | Reynolds et al. |
| 2017/0046004 A1 | 2/2017 | Choi |

(Continued)

FOREIGN PATENT DOCUMENTS

| | | |
|---|---|---|
| EP | 3040827 A1 | 7/2016 |
| WO | WO 2016/195388 A1 | 12/2016 |

*Primary Examiner* — Sanghyuk Park
(74) *Attorney, Agent, or Firm* — Fenwick & West LLP

(57) ABSTRACT

The present disclosure provides a display device for simultaneously performing display update and touch sensing in some intervals. The display device senses a touch by dividing ground voltage into two and changing one ground voltage and a data driving circuit may comprise a configuration for the signal conversion between the two ground voltages.

17 Claims, 14 Drawing Sheets

(56) References Cited

U.S. PATENT DOCUMENTS

2017/0102825 A1* 4/2017 Kim ................ G06F 3/0412
2018/0136778 A1* 5/2018 Choi ............... G06F 3/0412
2019/0065000 A1* 2/2019 Kim ................ G06F 3/0412
2019/0171320 A1* 6/2019 Kim ................ G06F 3/0443

* cited by examiner

PANEL DRIVING INTEGRATED CIRCUIT, DISPLAY DEVICE AND INTEGRATED CIRCUIT

CROSS REFERENCE TO RELATED APPLICATION

This application claims priority from Republic of Korea Patent Application No. 10-2017-0127003, filed on Sep. 29, 2017, which is hereby incorporated by reference in its entirety.

BACKGROUND

Field of Technology

The present disclosure relates to technology for driving a panel.

Description of the Prior Art

Technology for recognizing an object in proximity to or in contact with a touch panel is referred to as touch-sensing technology.

A touch panel is positioned in the same plane as a display panel, and accordingly, users may input a user control signal into the touch panel while viewing an image displayed on the display panel.

This method of generating the user control signal is remarkably intuitive for the user compared to other, previous, user control signal input types, for example, a mouse input type and a keyboard input type.

Because of such advantages, the touch-sensing technology is applied to various electronic devices having display panels.

Meanwhile, the touch panel may be completely separated from the display panel depending on the type thereof. For example, an add-on type of touch panel is completely separated from the display panel.

However, the touch panel and the display panel may share some components. For example, a sensor electrode positioned on the touch panel may be used as a common electrode of the display panel. An in-cell type corresponds thereto.

When the in-cell type panel is driven, in the conventional arts, the display device operates only in a display mode during a display interval and only in a touch mode during a touch interval based on interval division.

The conventional method uses a frame time divided into a display interval and a touch interval, and accordingly, a time longer than a certain time cannot be allocated to the touch interval.

In general, as the touch interval becomes longer, a signal-to-noise ratio (SNR) increases. In the conventional method, the length of the touch interval is short, so that the SNR is low and touch sensitivity is poor.

When the touch interval is set to be longer in order to increase touch sensitivity, the display interval becomes shorter and thus the number of circuit components for the display may increase. Meanwhile, when the touch interval is maintained rather than being increased in order to retain the display interval, the number of sensors should increase to improve touch sensitivity.

SUMMARY

An aspect of the present disclosure is to provide technology for increasing time for touch driving while maintaining time for display driving.

Another aspect of the present disclosure is to provide technology for increasing time for display driving while maintaining time for touch driving.

Another aspect of the present disclosure is to provide technology for increasing both time for display driving and time for touch driving.

Another aspect of the present disclosure is to provide technology for simultaneously performing display driving and touch driving in some or all intervals.

In order to achieve the above-described aspects, in accordance with an embodiment of the present disclosure, a display driving apparatus comprising a data driving circuit and a sensing circuit and further comprising a reference voltage conversion circuit is provided.

The data driving circuit in the panel driving apparatus can receive image data having a first ground voltage as a reference voltage through a first communication, convert the reference voltage of the image data from the first ground voltage into a second ground voltage through the reference voltage conversion, convert the image data into a data signal having the second ground voltage as a reference voltage, and supply the data signal to a data line.

The sensing circuit can convert a sensing signal for a sensor electrode into sensing data, convert the reference voltage of the sensing data from the second ground voltage into the first ground voltage through the reference voltage conversion, and transmit the sensing data through a second communication.

The reference voltage conversion circuit can convert signals received through a line distinguished from the first and the second communications and having the first ground voltage as a reference voltage into signals having the second ground voltage as a reference voltage.

In accordance with another embodiment, a display device comprising a panel, a timing control integrated circuit, a panel driving integrated circuit, and a level shifter is provided. The panel driving integrated circuit comprises a data driving circuit and a sensing circuit and may further comprise a reference voltage conversion circuit.

On the panel of the display device, pixels are defined by intersections of a plurality of data lines and a plurality of gate lines and sensor electrodes generating capacitances with an object may be disposed.

The timing control integrated circuit can generate reference clock signals used for driving the gate lines.

The data driving circuit can receive image data having the first ground voltage as a reference voltage from the timing control circuit through the first communication, convert the reference voltage of the image data from the first ground voltage into the second ground voltage through the reference voltage conversion, convert the image data into a data signal having the second ground voltage as a reference voltage, and supply the signal to the data line.

The sensing circuit can convert a sensing signal for a sensor electrode into the sensing data, convert the reference voltage of the sensing data from the second ground voltage into the first ground voltage through the reference voltage conversion, and transmit the sensing data through the second communication.

The reference voltage conversion circuit can receive a reference clock signal and convert the reference voltage of the reference clock signal from the first ground voltage into the second ground voltage through the reference voltage conversion.

The level shifter can generate a plurality of clock signals for driving the gate lines by shifting the voltage levels of the reference clock signals.

In accordance with another embodiment, an integrated circuit comprising an image data receiving part, a data signal part, and a reference voltage conversion part is provided.

The image data receiving part of the integrated circuit can receive image data from the timing control circuit through the first communication having the first ground voltage as a reference voltage.

The data signal part can convert the image data into a data signal having the second ground voltage as a reference voltage, and then supply the signal to the data line.

The reference voltage conversion part can convert the reference voltage of the reference clock signal received from the timing control circuit from the first ground voltage into the second ground voltage through the reference voltage conversion and transmit the converted reference clock signal to the level shifter.

As described above, an aspect of the present disclosure allows to increase time for touch driving while maintaining time for display driving. Another aspect of the present disclosure allows to increase time for display driving while maintaining time for touch driving. Another aspect of the present disclosure allows to increase both time for display driving and time for touch driving. Another aspect allows to simultaneously perform display driving and touch driving in some or all intervals.

DETAILED DESCRIPTION

Figure 1:
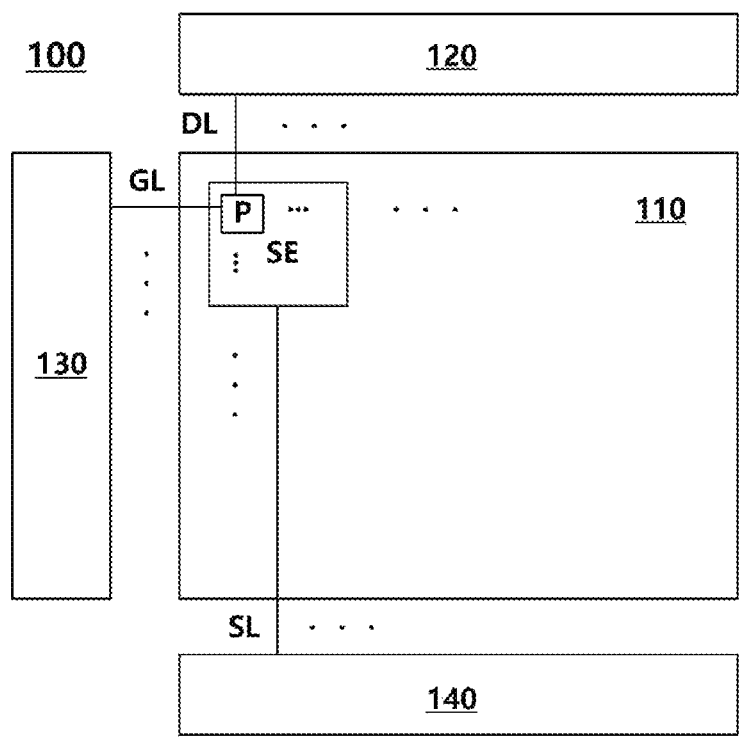
FIG. 1 schematically illustrates a display device according to the present disclosure.

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 schematically illustrates a display device according to the present disclosure.

Referring to FIG. 1, the display device 100 comprises a panel 110, a data driving circuit 120, a gate driving circuit 130, and a sensing circuit 140.

On the panel 110, a plurality of data lines DL connected to the data driving circuit 120 may be disposed and a plurality of gate lines GL connected to the gate driving circuit 130 may be disposed. In addition, a plurality of pixel P corresponding to points that a plurality of data lines DL and a plurality of gate lines GL intersect with each other may be defined on the panel 110.

On each pixel, a transistor may be formed, the transistor having a first electrode (for example, a source electrode or a drain electrode) connected to the data line DL, a gate electrode connected to the gate line GL, and a second electrode (for example, a drain electrode or a source electrode) connected to a display electrode.

Further, on the panel 110, a plurality of sensor electrodes SE may be further disposed to be spaced apart from each other. In the area where the sensor electrode SE is located, a pixel P or a plurality of pixels P may be located.

The panel 110 may comprise a display panel and a touch panel (touch screen panel: TSP) and the display panel and the touch panel may share some components. For example, a plurality of sensor electrodes SE may be components of the display panel (for example, common electrodes applying the common voltage) and also be components of the touch panel (sensor electrodes for sensing touches). The panel 110 may be referred to as an all-in-on panel in that some components are shared between the display panel and the touch panel, but the present disclosure is not limited thereto. Further, an in-cell type panel is a known form in which some elements are shared between a display panel and a touch panel, but it is only an example of the panel 110, and the panel to which the present disclosure is applied is not limited to the in-cell type panel.

The data driving circuit 120 supplies data signals to the data lines DL in order to display a digital image on pixels P of the panel 110.

The data driving circuit 120 may include at least one data driver integrated circuit. At least one such data driver integrated circuit may be connected to a bonding pad of the panel 110 in a tape-automated-bonding (TAB) manner or a chip-on-glass (COG) manner, directly formed on the panel 110, or integrated on the panel 110 depending on the circumstances. Further, the data driving circuit 120 may be implemented as a chip-on-film (COF) type.

The gate driving circuit 130 sequentially supplies scan signals to the gate lines GL in order to turn on or off the transistor located at each pixel P.

Depending on the driving method, the gate driving circuit 130 may be located on only one side of the panel 110 as illustrated in FIG. 1, or may be divided into two parts and located on both sides of the panel 110.

Further, the gate driving circuit 130 may include at least one gate driver integrated circuit. At least one such gate driver integrated circuit may be connected to a bonding pad of the panel 110 in a tape-automated-bonding (TAB) manner or a chip-on-glass (COG) manner, directly formed on the panel 110 in a gate-in-panel (GIP) manner, or integrated on the panel 110 depending on the circumstances. In addition, the gate driving circuit 130 may be implemented as a chip-on-film (COF) type.

The sensing circuit 140 supplies sensor driving signals to all or some of the plurality of sensor electrodes SE connected to the sensing lines SL.

As illustrated in FIG. 1, the sensing circuit 140 may be located outside the data driving circuit 120 and the gate driving circuit 130 as an element separate from the data driving circuit 120 and the gate driving circuit 130. However, depending on the implementing method, the sensing circuit 140 may be implemented as an internal element of a separate driver integrated circuit including at least one of the data driving circuit 120 and the gate driving circuit 130 or as an internal element of the data driving circuit 120 or the gate driving circuit 130.

Accordingly, an application of the sensor driving signals to all or some of the plurality of sensor electrodes SE by the sensing circuit 140 may be considered as an application of the sensor driving signals to all or some of the plurality of sensor electrodes SE by the separate driver integrated circuit comprising the sensing circuit 140. Further, depending on a designing method, it may be considered as an application of the sensor driving signals to all or some of the plurality of sensor electrodes SE by the data driving circuit 120 or the gate driving circuit 130, each comprising the sensing circuit 140.

The sensing circuit 140 is not limited to the above-described implementation and design methods and may be some other element or an element located inside or outside the other element if it has the same or similar function to be performed.

Further, although FIG. 1 illustrates that one sensing circuit 140 is located in the display device 100, the display device 100 may include two or more sensing circuits 140.

Meanwhile, in order that the sensing circuit 140 supplies the sensor driving signals to all or some of a plurality of sensor electrodes SE, a sensing line SL connected to each of a plurality of sensor electrodes (SE) is required. Accordingly, the sensing line SL connected to each of a plurality of sensor electrodes SE to transmit the sensor driving signals may be disposed in a first direction (for example, a vertical direction) or in a second direction (for example, a horizontal direction) on the panel 110.

Meanwhile, the display device 100 may adopt a capacitive touch type of recognizing the proximity or the touch of an object by sensing a change in capacitance through the sensor electrodes SE.

Such a capacitive touch type may be divided into, for example, a mutual capacitive touch type and a self-capacitive touch type.

In the mutual capacitive touch type, which is one of capacitive touch types, a sensor driving signal is applied to one sensor electrode (Tx electrode) and the other sensor electrode (Rx electrode) coupled to the Tx electrode is sensed. In the mutual capacitive touch type, a value sensed in the Rx electrode may vary depending on the proximity or the touch of the object such as a finger or a pen, and the presence or absence of the touch and touch coordinates are detected using the value sensed in the Rx electrode.

In the self-capacitive touch type, which is one of capacitive touch types, a sensor driving signal is applied to one sensor electrode SE and then this sensor electrode SE is sensed. In the self-capacitive touch type, the value sensed in the corresponding sensor electrode SE may vary depending on the proximity or the touch of the object such as a finger or a pen, and the presence or absence of the touch and touch coordinates are detected using the sensed value. In the self-capacitive touch type, the sensor electrode SE for applying the sensor driving signals is the same one as the sensed sensor electrode SE, so that there is no distinction such as the TX electrode or the RX electrode.

The display device 100 may adopt one of the above-described two capacitive touch types (the mutual capacitive touch type and the self-capacitive touch type). However, this specification describes an embodiment based on the assumption that the self-capacitive touch type is adopted for convenience of description.

Meanwhile, the display device 100 may drive the sensor electrodes SE without dividing a display interval from a touch interval. For example, the display device 100 may apply sensor driving signals to all or some of the sensor electrodes SE in an interval in which data signals are supplied.

For a specific example, the display device 100 may simultaneously supply the sensor driving signals to the sensor electrode SE while supplying data signals to the display electrode located on each pixel P. At this time the display device 100 may change the data signals in accordance with the sensor driving signals to constantly maintain data voltage generated between the display electrode and the sensor electrode SE of the pixel P for a certain period of time (for example, one frame duration).

Figure 2:
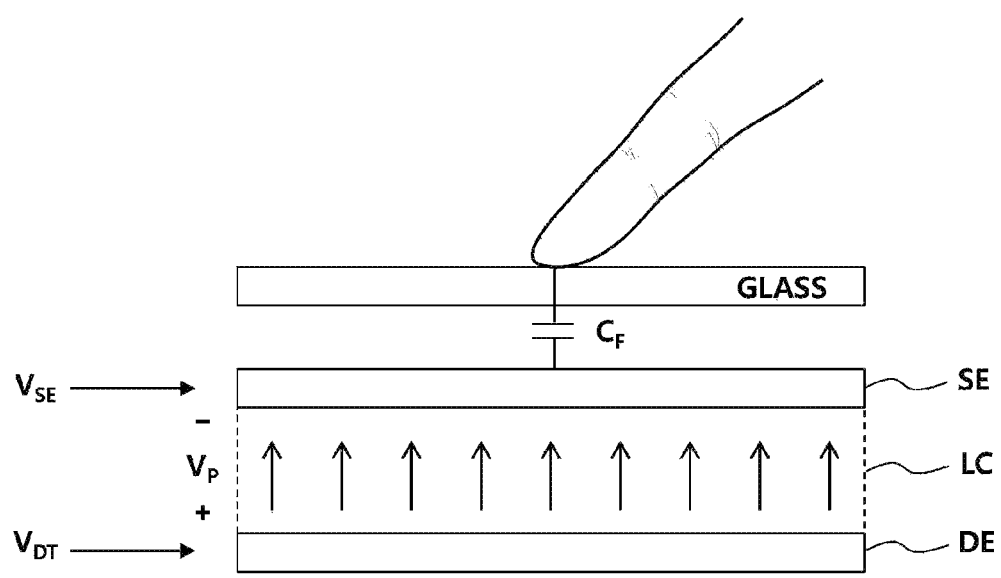
FIG. 2 schematically illustrates a cross-section of a pixel shown in FIG. 1.
Figure 3:
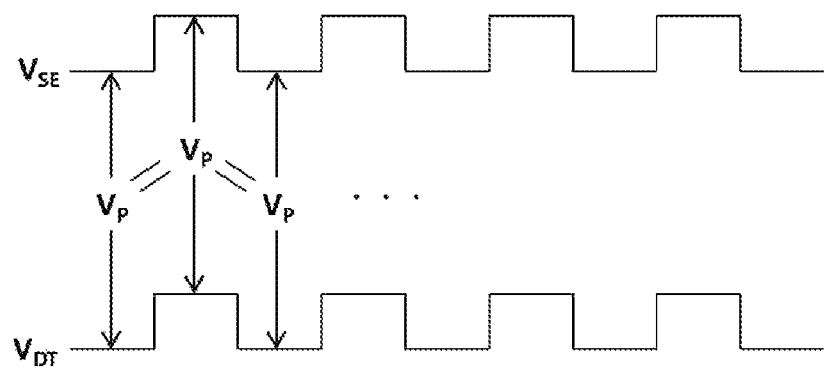
FIG. 3 schematically illustrates waveforms of signals supplied to each electrode shown in FIG. 2.
Figure 4:
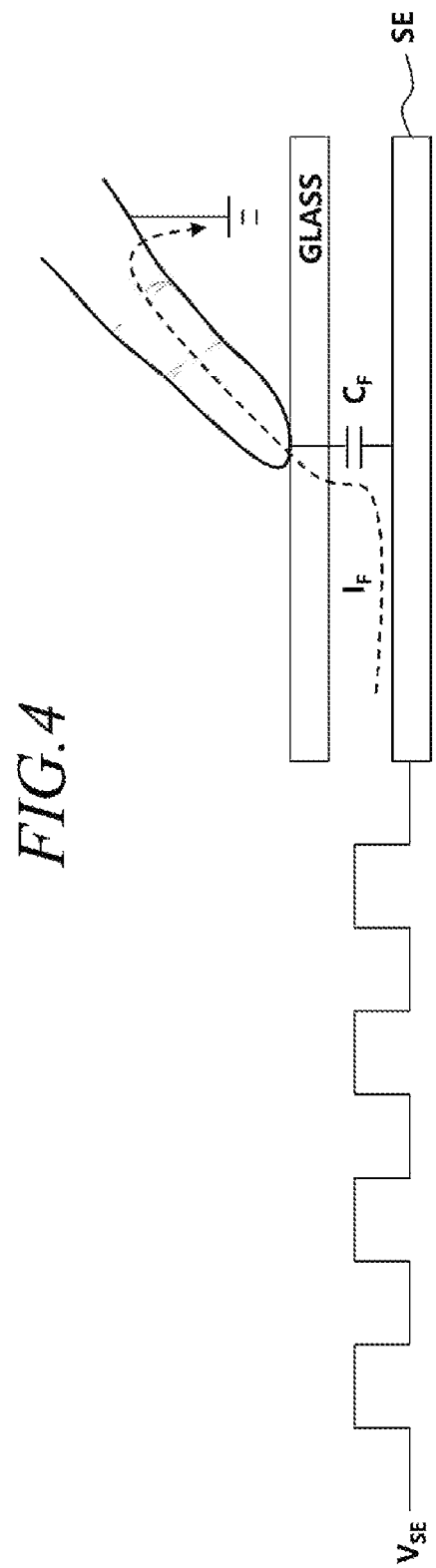
FIG. 4 illustrates a principle of sensing touches through sensor driving signals supplied to a sensor electrode.

FIG. 2 schematically illustrates a cross-section of a pixel shown in FIG. 1, FIG. 3 schematically illustrates waveforms of signals supplied to each electrode shown in FIG. 2, and FIG. 4 illustrates a principle of sensing touches through sensor driving signals supplied to a sensor electrode.

For convenience of description, a liquid crystal display (LCD) is shown in FIG. 2 as an example, however, this does not mean that the present embodiment is limited to the liquid crystal display. For example, the present embodiment may be applied to organic light emitting diode (OLED) devices.

Referring to FIG. 2, liquid crystal LC may be located between the display electrode DE and the sensor electrode SE.

Referring to FIGS. 2 and 3, data signals $V_{DT}$ may be supplied to the display electrode DE and sensor driving signals $V_{SE}$ may be supplied to the sensor electrode SE.

Depending on these signals $V_{DT}$ and $V_{SE}$, data voltage $V_P$ may be generated in the liquid crystal LC by a potential difference between the display electrode DE and the sensor electrode SE. An electric field is formed by such data voltage $V_P$ and the orientation of liquid crystal LC is determined depending on such an electric field to determine the brightness or the gray scale of a pixel P.

To constantly maintain the brightness or the gray scale of a pixel P for a certain period of time (for example, one frame duration), the data voltage $V_P$ may be maintained for the corresponding period of time.

Meanwhile, the sensor driving signals $V_{SE}$ may have a regularly modulated waveform for the corresponding period of time (for example, one frame duration) to measure capacitive coupling $C_F$ formed between the sensor electrode SE and an external object. Referring to FIG. 4, the sensor driving signal $V_{SE}$ may have an AC waveform that varies periodically. According to the AC waveform of the sensor driving signal $V_{SE}$, touch current IF may flow to the coupling $C_F$ formed between the sensor electrode $V_{SE}$ and the object and it can be determined whether the object is in proximity to or in contact with the sensor electrode SE according to the amount of the touch current IF or the presence or absence of the touch current IF.

Meanwhile, since the sensor electrode SE and the display electrode DE are linked with each other, if the sensor driving signal $V_{SE}$ is regularly changed as described above, the data signal $V_{DT}$ may also be regularly changed.

Referring to FIG. 3, the data signal $V_{DT}$ may be changed in accordance with the sensor driving signal $V_{SE}$ in order to maintain a constant data voltage $V_P$ between the data signal $V_{DT}$ and the sensor driving signal $V_{SE}$. For a specific example, the data signal $V_{DT}$ may be changed with the same phase and the same amplitude as those of the sensor driving signal $V_{SE}$.

Meanwhile, although FIGS. 3 to 4 illustrate the sensor driving signal $V_{SE}$ as a signal having a constant frequency and amplitude, various modulation methods may be additionally applied to the sensor driving signal $V_{SE}$.

For example, a frequency modulation method may be applied to the sensor driving signal $V_{SE}$. In this case, the sensing circuit 140 may sense the touch through a method of modulating the frequency of the sensor driving signal $V_{SE}$, supplying the modulated sensor driving signal $V_{SE}$ to the sensor electrode SE, and demodulating a sensing signal for the sensor electrode SE. At this time, the sensing circuit 140 may select a modulated frequency of the sensor driving signal $V_{SE}$ such that the noise by a frequency (for example, a frequency of 60 Hz or a harmonic frequency thereof) used for updating a display or a frequency generated by another circuit (for example, the data driving circuit) is avoided.

For another example, a phase modulation method or a code modulation method may be applied to the sensor driving signal $V_{SE}$. In this case, the sensing circuit 140 may sense the touch through a method of demodulating the sensing signal according to the modulation method used for modulating the sensor driving signal $V_{SE}$.

Meanwhile, in the display device 100, a method of changing ground voltage linked with the data signal $V_{DT}$ may also be used in order to change the data signal $V_{DT}$ in accordance with the sensor driving signal $V_{SE}$, as described with reference to FIGS. 2 to 4. A method of changing the data signal $V_{DT}$ by the change in the ground voltage will be described with reference to FIGS. 5 and 6.

Figure 5:
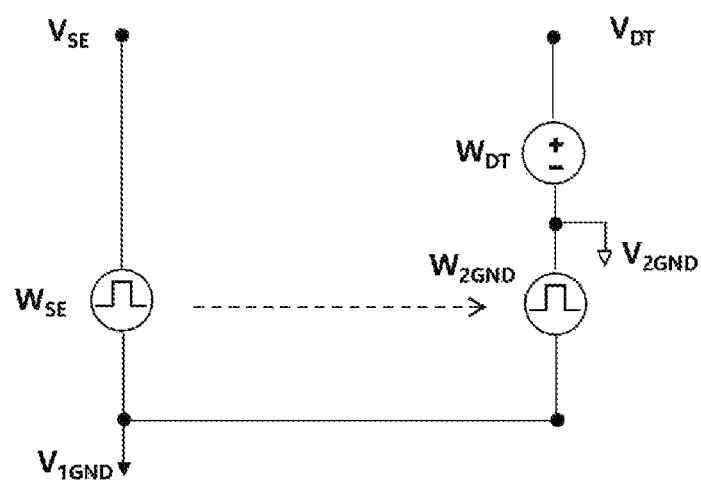
FIG. 5 illustrates ground voltages of a data signal and a sensor driving signal.
Figure 6:
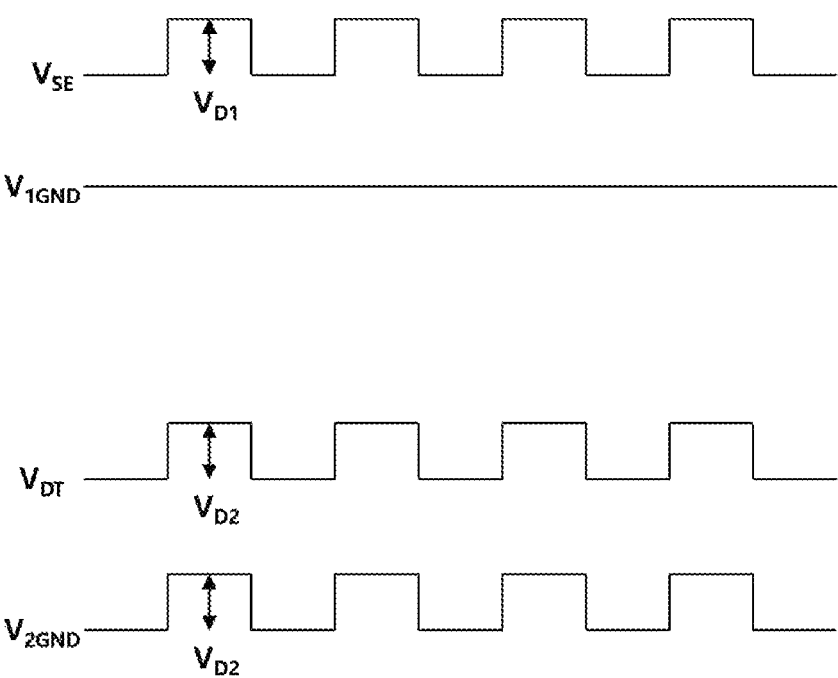
FIG. 6 illustrates waveforms of the data signal, the sensor driving signal and the ground voltage shown in FIG. 5.

FIG. 5 illustrates ground voltages of a data signal and a sensor driving signal and FIG. 6 illustrates waveforms of the data signal, the sensor driving signal and the ground voltage shown in FIG. 5.

Referring to FIG. 5, the sensor driving signal $V_{SE}$ may be linked with a first ground voltage $V_{1GND}$ through a sensor driving voltage generator $W_{SE}$, and the data signal $V_{DT}$ may be linked with a second ground voltage $V_{2GND}$ through a data driving voltage generator $W_{DT}$. At this time, the second ground voltage $V_{2GND}$ may receive voltage from a second ground voltage generator $W_{2GND}$, and the second ground voltage generator $W_{2GND}$ may be linked with the sensor driving voltage generator $W_{SE}$.

Specifically, one side of the sensor driving voltage generator $W_{SE}$ may be connected to the first ground voltage $V_{1GND}$ and the other side thereof may output the sensor driving signal $V_{SE}$. One side of the data driving voltage generator $W_{DT}$ may be connected to the second ground voltage $V_{2GND}$ and the other side thereof may output the data signal $V_{DT}$. One side of the second ground voltage generator $W_{2GND}$ may be connected to the first ground voltage $V_{1GND}$ and the other side thereof may output the second ground voltage $V_{2GND}$. At this time, the second ground voltage generator $W_{2GND}$ may operate through a link with the sensor driving voltage generator $W_{SE}$.

Referring to FIGS. 5 and 6, the sensor driving signal $V_{SE}$ may have a regularly modulated waveform in order to drive the sensor electrode SE. At this time, the waveform of the sensor driving signal $V_{SE}$ may be supplied by the sensor driving voltage generator $W_{SE}$ linked with the first ground voltage $V_{1GND}$.

The data signal $V_{DT}$ may receive a waveform from the data driving voltage generator $W_{DT}$, and at this time, the waveform from the data driving voltage generator $W_{DT}$ may maintain a constant voltage for a certain period of time (for example, one frame duration). However, the data driving voltage generator $W_{DT}$ is connected with the second ground voltage generator $W_{2GND}$ and the waveform of the data signal $V_{DT}$ may be changed according to the waveform of the second ground voltage generator $W_{2GND}$.

Referring to FIGS. 5 and 6, the second ground voltage $V_{2GND}$ may be regularly changed according to the waveform supplied by the second ground voltage generator $W_{2GND}$. The data signal $V_{DT}$ is linked with the second ground voltage $V_{2GND}$ so that it may be changed identically to the second ground voltage $V_{2GND}$.

Specifically, the sensor driving voltage generator $W_{SE}$ may supply the sensor driving signal $V_{SE}$, which varies with a first amplitude $V_{D1}$. At this time, the second ground voltage generator $W_{2GND}$, linked with the sensor driving voltage generator $W_{SE}$, may supply the second ground voltage $V_{2GND}$ having the same phase as that of the sensor driving signal $V_{SE}$ and varying with a second amplitude $V_{D2}$. Since one side of the data driving voltage generator $W_{DT}$ is connected with the second ground voltage $V_{2GND}$, the data signal $V_{DT}$, which is the output voltage thereof, may also vary with a second amplitude $V_{D2}$ and having the same phase as that of the sensor driving signal $V_{SE}$, like the second ground voltage $V_{2GND}$.

Meanwhile, the second ground voltage $V_{2GND}$ may be changed with respect to the first ground voltage $V_{1GND}$. The change of voltage may be explained in comparison with the reference voltage and the change of the second ground voltage $V_{2GND}$ may be compared with the first ground voltage $V_{1GND}$. As illustrated in FIG. 6, when taking the first ground voltage $V_{1GND}$ as a reference voltage, the second ground voltage $V_{2GND}$ can be recognized to be changed with respect to the first ground voltage $V_{1GND}$.

Meanwhile, the sensor driving signal $V_{SE}$ may have a modulated waveform only in a particular interval.

Figure 7:
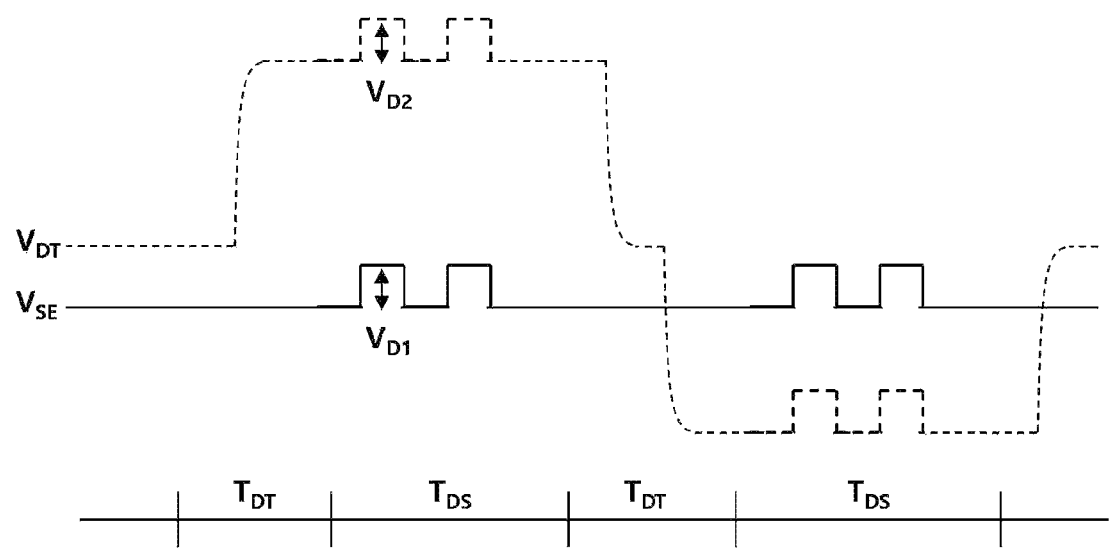
FIG. 7 illustrates a sensor driving signal modulated only during particular intervals and a waveform of the data signal corresponding thereto.

FIG. 7 illustrates a sensor driving signal modulated only during particular intervals and a waveform of the data signal corresponding thereto.

Referring to FIG. 7, the data signal $V_{DT}$ may have a waveform divided into a transition interval $T_{DT}$ and a stabilization interval $T_{DS}$.

The transition interval $T_{DT}$ is an interval in which the data signal $V_{DT}$ is changed. For example, the data signal $V_{DT}$ has a waveform for forming the data voltage on a plurality of pixels (see P in FIG. 8), and at this time, the interval in which the voltage for a first pixel is changed into the voltage for a second pixel is a transition interval $T_{DT}$. The transition interval $T_{DT}$ may correspond to an interval in which transistors (see $T_D$ in FIG. 8) connected to data lines (see DL in FIG. 8) are not turned on.

The stabilization interval $T_{DS}$ is an interval in which the data signal $V_{DT}$ is stabilized. For example, when the transistor (see $T_D$ in FIG. 8) connected to the pixel (see P in FIG. 8) is turned on, the data signal $V_{DT}$ has a stabilized voltage level at which the data voltage of the corresponding pixel (see P in FIG. 8) is constantly maintained, which corresponds to the stabilization interval $T_{DS}$. The stabilization interval $T_{DS}$ may correspond to an interval in which the transistor (see $T_D$ in FIG. 8) connected to the data line (see DL in FIG. 8) is turned on.

Referring to FIG. 7, the sensor driving signal $V_{SE}$ may have a modulated waveform only in the stabilization interval $T_{DS}$. Specifically, the sensor driving signal $V_{SE}$ may maintain a constant value in the transition interval $T_{DT}$, and may be modulated to a square wave having a first amplitude $V_{D1}$ in the stabilization interval $T_{DS}$. At this time, the second ground voltage $V_{2GND}$ linked with the sensor driving signal $V_{SE}$ may be modulated to a square wave having a second amplitude $V_{D2}$ only in the stabilization interval $T_{DS}$, and the data signal $V_{DT}$ linked with the second ground voltage $V_{2GND}$ may be changed to have the second amplitude $V_{D2}$ only in the stabilization interval $T_{DS}$.

As described above, in the display device 100, the data signal $V_{DT}$ may be changed in accordance with the sensor driving signal $V_{SE}$ by changing the second ground voltage $V_{2GND}$ linked with the data signal $V_{DT}$.

Figure 8:
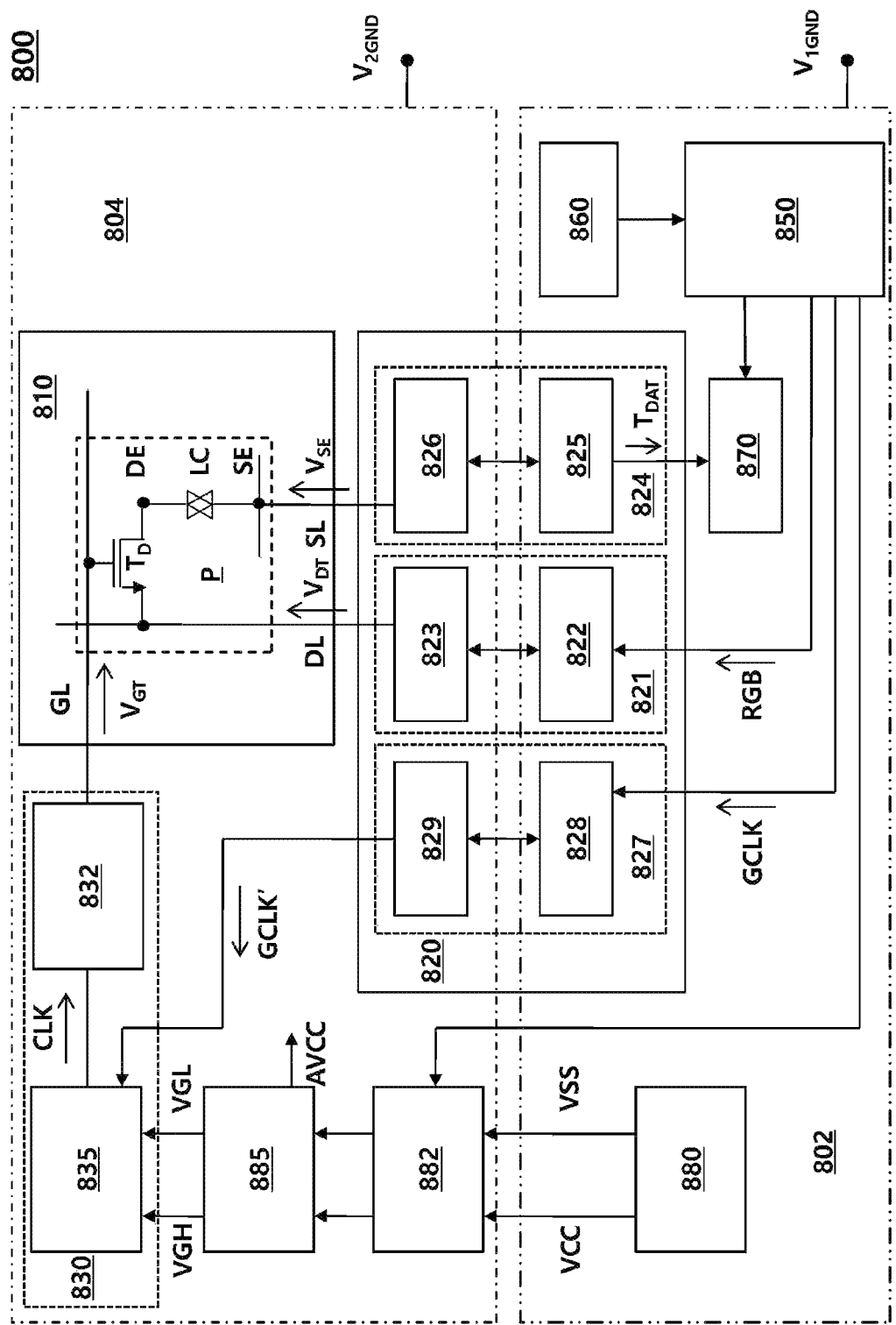
FIG. 8 is a block diagram of a display device according to the first embodiment.

FIG. 8 is a block diagram of a display device according to the first embodiment.

The display device 800 may be divided into two blocks 802 and 804. Each of two blocks 802 and 804 may use a ground voltage different from each other as a reference voltage.

Elements disposed in the first block 802 may use the first ground voltage $V_{1GND}$ as a reference voltage and elements disposed in the second block 804 may use the second voltage $V_{2GND}$ as a reference voltage.

The display device 800 may comprise a panel 810 and elements 820, 830, 835, 850, 860, 870, 880, 882, and 885 for driving the panel. Some of these elements may be disposed in the first block 802 and the others may be disposed in the second block 804.

For example, a host 860 for generating image data and a timing control circuit 850 for generating various kinds of control signals may be disposed in the first block 802 and the panel 810 for displaying images according to the image data may be disposed in the second block 804.

As described above, since some elements are disposed in the first block 802 of the display device 800 and the others are disposed in the second block 804 thereof, the display device 800 may comprise a plurality of reference voltage conversion elements for transmitting signals in the first block 802 to the second block 804.

For example, since the image data generated in the host 860 disposed in the first block 802 and transmitted to the timing control circuit 850 has the first ground voltage $V_{1GND}$ as a reference voltage while the panel 810 disposed in the second block 804 uses the second ground voltage $V_{2GND}$ as a reference voltage, reference voltage conversion elements for converting the first ground voltage $V_{1GND}$ into the second ground voltage $V_{2GND}$ are required.

Each of a data driving circuit 821, a sensing circuit 824, and a reference voltage conversion circuit 827 included in the display device 800 may comprise an element for changing the reference voltage.

The data driving circuit 821 may convert the image data RGB into the data signal $V_{DT}$ and then supply to the data line DL.

The data driving circuit 821 may comprise an image data receiving part 822 and a data signal part 823. The image data receiving part 822 may receive the image data RGB through a first communication, using the first ground voltage $V_{1GND}$ as a reference voltage, such as clock embedded differential signaling (CEDS).

The first communication may be a serial communication. The serial communication is a method for transmitting data using at least two wires and it has an advantage that the wiring is simple. Since a space for wiring between a timing control circuit 850 and a data driving circuit 821 becomes narrower as a display device becomes slimmer, image data RGB may be transmitted through the serial communication for an efficient data transmission in a narrow wiring space.

The first communication may be a serial communication transmitting an embedded clock signal where a clock is embedded. In a serial communication, clocks may be transmitted along with data to synchronize clocks of a transmitter and a receiver. The first communication may adopt an embedded clock type that a clock is embedded in a signal. According to the embedded clock type, since a clock included in a signal is transmitted through a data transmission line, it has an advantage that there is no need to wire a separate clock line.

Meanwhile, in a serial communication, to transmit the same amount of data as that in a parallel communication, a relatively high-speed communication, i.e. a communication with high frequency is required compared with a parallel communication, however, it is generally known that the high-speed communication is not suitable for the reference voltage conversion.

The data driving circuit 821 may carry out a parallel signal process for image data RGB received through the first communication. The parallel signal process is, for example, to convert the serial communication into the parallel communication. Through this process, data transmitted in serial is diverged and transmitted to N (N is a natural number of 2 or larger) parallel transmission lines. The data driving circuit 821 may carry out the reference voltage conversion of image data RGB during the parallel signal process. The parallel signal process may be carried out in the image data receiving part 822 or in the data signal part 823, and the reference voltage conversion may be carried out in the data signal part 823.

The image data of which the reference voltage is changed from the first ground voltage $V_{1GND}$ into the second ground voltage $V_{2GND}$ through the reference voltage conversion may be converted into the data signal $V_{DT}$ having the second ground voltage $V_{2GND}$ as a reference voltage in the data signal part 823 and supplied to the data line DL.

The sensing circuit 824 may convert the sensing signal for the sensor electrode SE into the sensing data $T_{DAT}$ and transmit the sensing data to the sensing control circuit 870 through the second communication.

The sensing circuit 824 may transmit the sensor driving signal $V_{SE}$ through the sensing line SL. The sensor driving signal $V_{SE}$ is a signal having the second ground voltage $V_{2GND}$ as a reference voltage and the second ground voltage $V_{2GND}$ may be changed with respect to the first ground voltage $V_{1GND}$. In another aspect, the sensor driving signal $V_{SE}$ may be changed with respect to the first ground voltage $V_{1GND}$.

The sensing signal for the sensor electrode SE is a signal having the second ground voltage $V_{2GND}$ as a reference voltage and the sensing data obtained by converting the sensing signal into the digital signal may have the second ground voltage $V_{2GND}$ as a reference voltage at first. Next, the sensing circuit 824 may convert the reference voltage of the sensing data from the second ground voltage $V_{2GND}$ into the first ground voltage $V_{1GND}$ by the reference voltage conversion. Then the sensing circuit 824 may transmit the sensing data $T_{DAT}$ to the sensing control circuit 870 through the second communication having the first ground voltage $V_{1GND}$ as a reference voltage.

The sensing circuit 824 may internally convert the reference voltage of the sensing data in the parallel signal process. In addition, when transmitting the sensing data $T_{DAT}$ to the sensing control circuit 870, the sensing circuit 824 may transmit the sensing data $T_{DAT}$ through the serial communication.

The sensing circuit 824 may comprise a sensing part 826 and a sensing data transmission part 825. The process of the sensing signal and the conversion of the reference voltage of the sensing data may be carried out by the sensing part 826 and the transmission of the sensing data $T_{DAT}$ through the second communication may be carried out by the sensing data transmission part 825.

Meanwhile, the sensor electrode SE may be used as a common electrode supplied with common voltage. The voltage between the common electrode and the display electrode DE should be constant to keep the liquid crystal LC being a constant state. In the present embodiment, since the sensor driving signal $V_{SE}$ supplied to the sensor electrode is not substantially changed with respect to the second ground voltage $V_{1GND}$, the sensor driving signal $V_{SE}$ does not influence the display driving. Accordingly, the supply of the data signal $V_{DT}$ to the data driving circuit 821 and the sensing of the sensor electrode by the sensing circuit 824 may simultaneously be carried out. In another aspect, the simultaneous driving may be considered that the data driving circuit 821 (for example, the data signal part 823) and the sensing circuit 824 (for example, the sensing part 826) asynchronously or independently operate.

Although it is not shown in the drawings, the sensor electrode may be a cathode electrode of an organic light emitting diode (OLED) placed on a pixel. Or, the sensor electrode may be an anode electrode of an organic light emitting diode (OLED) or a separately provided electrode.

Meanwhile, on each pixel P of the panel 810, a transistor $T_D$ is disposed and the gradation of a pixel P may be controlled according to the driving of the transistor $T_D$. A gate of such a transistor $T_D$ may be connected with a gate line GL and a drain or a source may be connected with a data line DL. To the gate line GL, a scan signal $V_{GT}$ generated in the gate driving circuit 830 is supplied, and to the data line DL, a data signal $V_{DT}$ generated in the data driving circuit 821 may be supplied.

The gate driving circuit 830 may sequentially supply the scan signals $V_{GT}$ to each row or each column so that a plurality of pixels P disposed on the panel 810 can be selected by a row or by a column. At this time, the sequence of the scan signals $V_{GT}$ supplied to each row or each column may be determined by a reference clock signal GCLK supplied from the timing control circuit 850.

The reference clock signal GCLK is generated with the first ground voltage $V_{1GND}$ as a reference voltage and the reference voltage conversion of the reference clock signal GCLK may be carried out by the reference voltage conversion circuit 827. The reference voltage conversion circuit 827 can convert reference voltage of a digital signal or a clock signal from the first ground voltage $V_{1GND}$ into the second ground voltage $V_{2GND}$ and a signal to be changed may be a reference clock signal GCLK.

The reference voltage conversion circuit 827 may comprise a signal receiving part 828 and a reference voltage conversion part 829.

The signal receiving part 828 may receive a signal having the first ground voltage $V_{1GND}$ as a reference voltage (for example, a reference clock signal GCLK).

Regarding a signal having the first ground voltage $V_{1GND}$ as a reference voltage, the reference voltage conversion part 829 may convert the reference voltage of the above-mentioned signal from the first ground voltage $V_{1GND}$ into the second ground voltage $V_{2GND}$ through the reference voltage conversion and transmit the converted signal to a different device placed in the second block 804 (for example, a level shifter 835).

For example, the signal receiving part 828 may receive the reference clock signal GCLK from the timing control circuit 850. The reference voltage conversion part 829 may convert the reference voltage of the reference clock signal GCLK from the first ground voltage $V_{1GND}$ into the second ground voltage $V_{2GND}$ through the reference voltage conversion and transmit the converted reference clock signal GCLK' to the level shifter 835.

The level shifter 835 may convert the voltage level of the reference clock signal GCLK to generate a clock signal CLK and transmit the clock signal CLK to a scan signal supply part 832.

The level shifter 835 may generate one clock signal CLK from one reference clock signal GCLK or a plurality of clock signals CLK from one reference clock signal GCLK. In the present embodiment, a type that a plurality of clock signals are generated from one reference clock signal may be adopted. In this type, the level shifter 835 may be synchronized with the edges of two reference clock signals GCLK to generate a plurality of clock signals CLK for generating scan signals VGT.

The level shifter 835 may shift the voltage level of the reference clock signal GCLK by receiving a gate high voltage VGH and a gate low voltage VGL.

The display device 800 may comprise a first power management circuit 880 linked with the first ground voltage $V_{1GND}$ and a second power management circuit 885 linked with the second ground voltage $V_{2GND}$ and the gate high voltage VGH and the gate low voltage VGL may be supplied through the second power management circuit 885.

The first power management circuit 880 may receive electric power from outside to generate a first driving voltage VCC and a first base voltage VSS and supply the first driving voltage VCC to the elements using the first ground voltage $V_{1GND}$ as a reference voltage, for example, the timing control circuit 850, the host 860, the sensing control circuit 870, or the like.

The second power management circuit 885 may receive electric power from the first power management circuit 880 to generate the driving voltage, for example, the gate high voltage VGH, the gate low voltage VGL, the second driving voltage AVCC, or the like and supply the gate high voltage VGH and the gate low voltage VGL to the level shifter 885.

Some parts of the data driving circuit 821, the sensing circuit 824, and the reference voltage conversion circuit 827 may be linked with the first ground voltage $V_{1GND}$ and the others may be linked with the second ground voltage $V_{2GND}$, the first power management circuit 880 may supply the first driving voltage VCC to the parts linked with the first ground voltage $V_{1GND}$ in the data driving circuit 821, the sensing circuit 824, and the reference voltage conversion circuit 827 and the second power management circuit 882 may supply the second driving voltage AVCC to the parts linked with the second ground voltage $V_{2GND}$ in the data driving circuit 821, the sensing circuit 824, and the reference voltage conversion circuit 827.

Meanwhile, the second power management circuit 885 receives electric power from the first power management circuit 880 and a junction circuit 882 may be disposed between the two power management circuits 880 and 885 to harmonize the ground voltages different from each other between the two power management circuits 880 and 885. Here, the junction circuit 882 may comprise at least one switch and drive the switch at the point that the second ground voltage $V_{2GND}$ becomes adjacent to the first ground voltage $V_{1GND}$ to transmit the electric power of the first power management circuit 880 to the second power management circuit 885.

Meanwhile, the data driving circuit 821, the sensing circuit 824, and the reference voltage conversion circuit 827 may constitute a panel driving circuit and be embedded in one integrated circuit package 820, for example, a touch display driver IC (TDDI) package. Other elements driving the panel may be realized in integrated circuit forms. For example, the timing control circuit 850 may be realized as a timing control integrated circuit and the gate driving circuit 830 may be realized as a gate driving integrated circuit. In addition, the first power management circuit 880 and the second power management circuit 885 may be realized as one power management integrated circuit.

Figure 9:
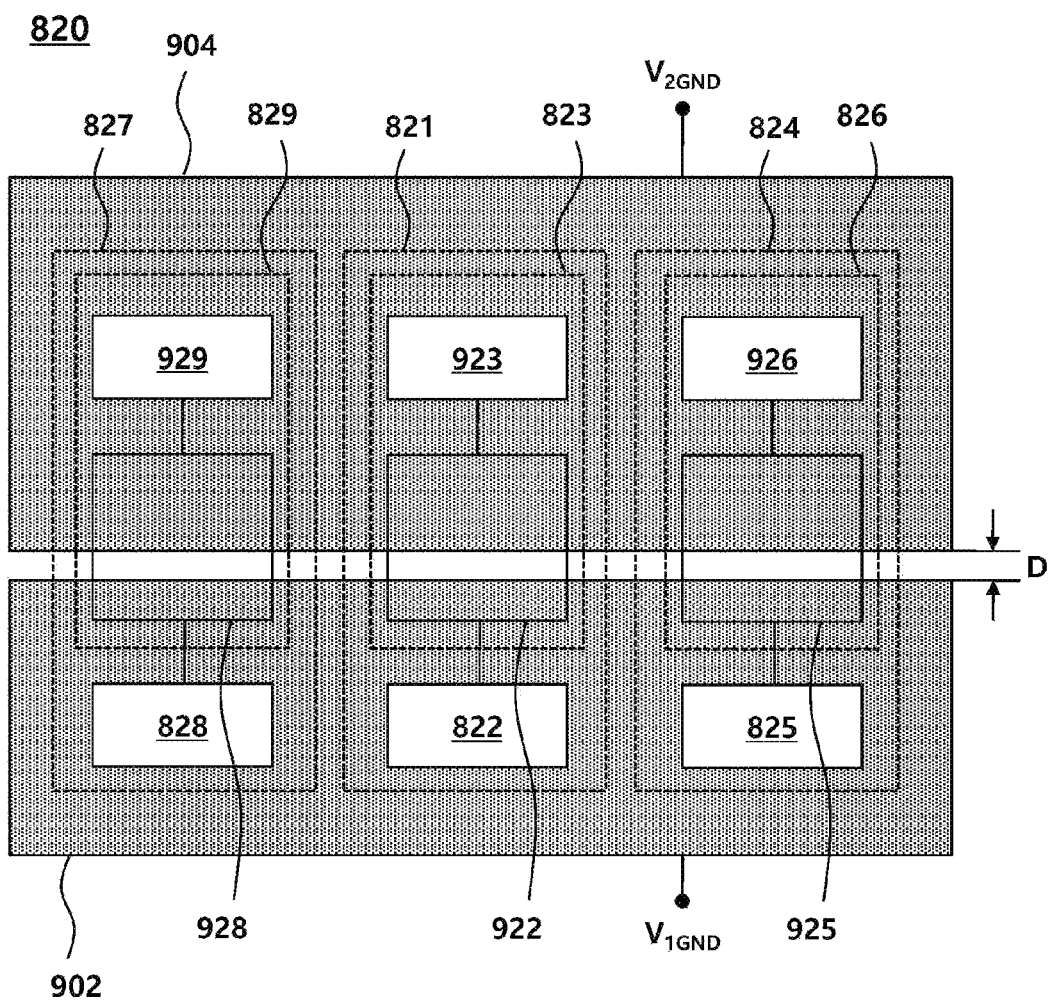
FIG. 9 is a block diagram of a TDDI package according to the first embodiment.

FIG. 9 is a block diagram of a TDDI package according to the first embodiment.

Referring to FIG. 9, in the TDDI package 820, a first ground pattern 902 where the first ground voltage $V_{1GND}$ is generated and a second ground pattern 904 where the second ground voltage $V_{2GND}$ is generated may be placed. The first ground pattern 902 and the second ground pattern 904 may be separated from each other with maintaining an insulation distance more than a certain amount. At this point, the separation means a state that direct current does not substantially flow. Between the first ground pattern 902 and the second ground pattern 904, a capacitance may be formed for the signal transmission and a high impedance element making a very small amount of current flow, for example, a resistance at Mega-ohm level may be connected.

Some parts of the circuits 821, 824, or 827 comprised in the TDDI package 820 may be linked with the first ground pattern 902, another parts may be linked with the second ground pattern 904, and the rest may be located over both the first ground pattern 902 and the second ground pattern 904.

For example, the data driving circuit 821 comprises the image data receiving part 822 and the data signal part 823 and the image data receiving part 822 may be linked with the first ground pattern 902. In addition, the data signal part 823 may comprise a first reference voltage conversion part 922 and a data signal supply part 923, the data signal supply part 923 may be linked with the second ground pattern 904, and the first ground voltage conversion part 922 may be located over both the first ground pattern 902 and the second ground pattern 904 to convert the reference voltages of signals received from and transmitted to the both sides.

The sensing circuit 824 comprises the sensing part 824 and the sensing data transmission part 825 and the sensing data transmission part 825 may be linked with the first ground pattern 902. In addition, the sensing part 824 may comprise a second reference voltage conversion part 925 and a sensing signal processing part 926, the sensing signal processing part 926 may be linked with the second ground pattern 904, and the second reference voltage conversion part 925 may be located over both the first ground pattern 902 and the second ground pattern 904 to convert the reference voltages of signals received from and transmitted to the both sides.

The reference voltage conversion circuit 827 comprises the signal receiving part 828 and the reference voltage conversion part 829 and the signal receiving part 828 may be linked with the first ground pattern 902. In addition, the reference voltage conversion part 829 may comprise a third reference voltage conversion part 928 and a signal transmission part 929, the signal transmission part 929 may be linked with the second ground pattern 904, and the third reference voltage conversion part 928 may be located over both the first ground pattern 902 and the second ground pattern 904 to convert the reference voltages of signals received from and transmitted to the both sides.

Meanwhile, a configuration of the reference voltage conversion such as the first reference voltage conversion part 922, the second reference voltage conversion part 925, the third voltage conversion part 928, or the like may comprise interface conversion circuits for converting reference voltage of a signal.

Figure 10:
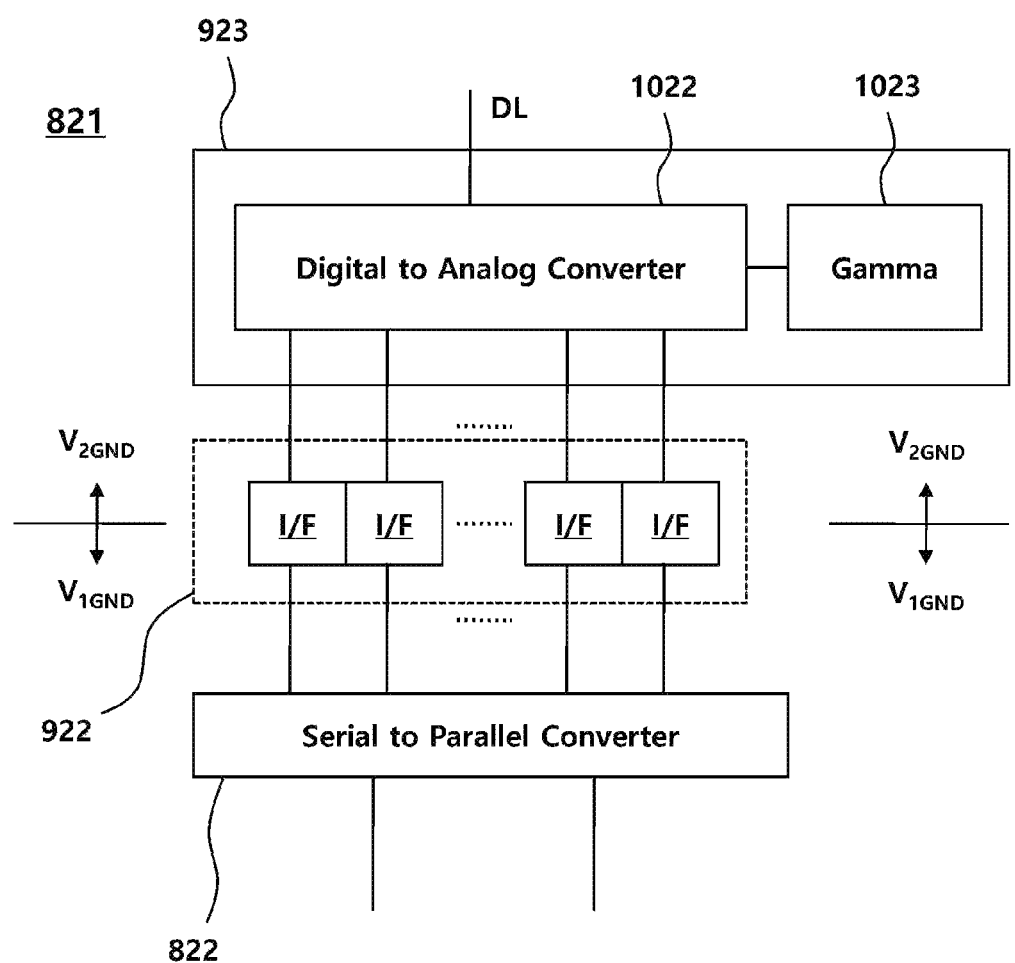
FIG. 10 is a block diagram of a data driving circuit according to the first embodiment.
Figure 11:
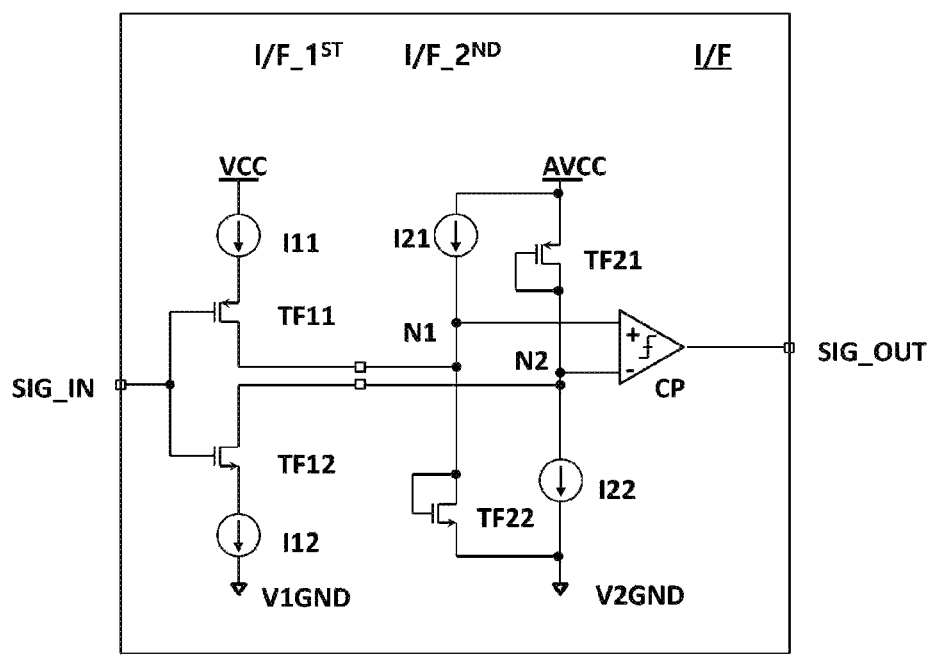
FIG. 11 is an example block diagram of an interface conversion circuit according to the first embodiment.

FIG. 10 is a block diagram of a data driving circuit according to the first embodiment and FIG. 11 is an example block diagram of an interface conversion circuit according to the first embodiment.

Referring to FIG. 10, the data driving circuit 821 may convert the reference voltage of image data using a plurality of interface conversion circuits I/F.

The data driving circuit 821 may comprise the image data receiving part 822, the first reference voltage conversion part 922, and the data signal part 923. The image data receiving part 822 may be linked with the first ground voltage $V_{1GND}$, the data signal part 923 may be linked with the second ground voltage $V_{2GND}$, and the first reference voltage conversion part 922 may convert the reference voltage of image data from the first ground voltage $V_{1GND}$ into the second ground voltage $V_{2GND}$.

The image data receiving part 822 may convert image data received in serial communication into parallel signals to transmit the converted signals to the first reference voltage conversion part 922.

The first reference voltage conversion part 922 may convert the reference voltage of each signal inputted in parallel using a plurality of interface conversion circuits I/F from the first ground voltage $V_{1GND}$ into the second ground voltage $V_{2GND}$.

The first reference voltage conversion part 922 may transmit the image data outputted in parallel to a digital-analog-converter (DAC) 1022 comprised in the data signal part 923 and the DAC 1022 may convert the image data into a data signal using gamma voltage generated in a gamma voltage part 1023. Here, the DAC 1022 and the gamma voltage part 1023 may use the second ground voltage $V_{2GND}$ as a reference voltage.

Referring to FIG. 11, the interface conversion circuit I/F may comprise a primary side circuit $I/F\_1^{ST}$ connected with the first ground voltage $V_{1GND}$ and the first driving voltage VCC and a secondary side circuit $I/F\_2^{ND}$ connected with the second ground voltage $V_{2GND}$ and the second driving voltage AVCC.

The primary side circuit I/F_1$^{ST}$ may comprise a first transistor TF11 and a second transistor TF12 and further comprise a first current source 111 positioned between the first transistor TF11 and the first driving voltage VCC and a second current source 112 positioned between the second transistor TF12 and the first ground voltage V$_{1GND}$.

The secondary side circuit I/F_2$^{ND}$ may comprise a third transistor TF21 and a fourth transistor TF22 and further comprise a third current source 121 connected with the second driving voltage AVCC and located in parallel to the third transistor TF21 and a fourth current source 122 connected with the second ground voltage V$_{2GND}$ and located in parallel to the fourth transistor TF22.

The third current source 121, the fourth transistor TF22, and the first transistor TF11 are connected with each other through a first node N1 and the fourth current source 122, the third transistor TF21, and the second transistor TF12 are connected with each other through a second node N2.

Input signals SIG_IN of the interface conversion circuit I/F are connected to a gate of the first transistor TF11 and the second transistor TF12.

The first node N1 and the second node N2 are connected to a comparator CP and the output of the comparator CP is connected to an output signal SIG_OUT.

According to this configuration, the input signals SIG_IN linked with the first ground voltage V$_{1GND}$ may be converted into the output signals SIG_OUT linked with the second ground voltage V$_{2GND}$.

Figure 12:
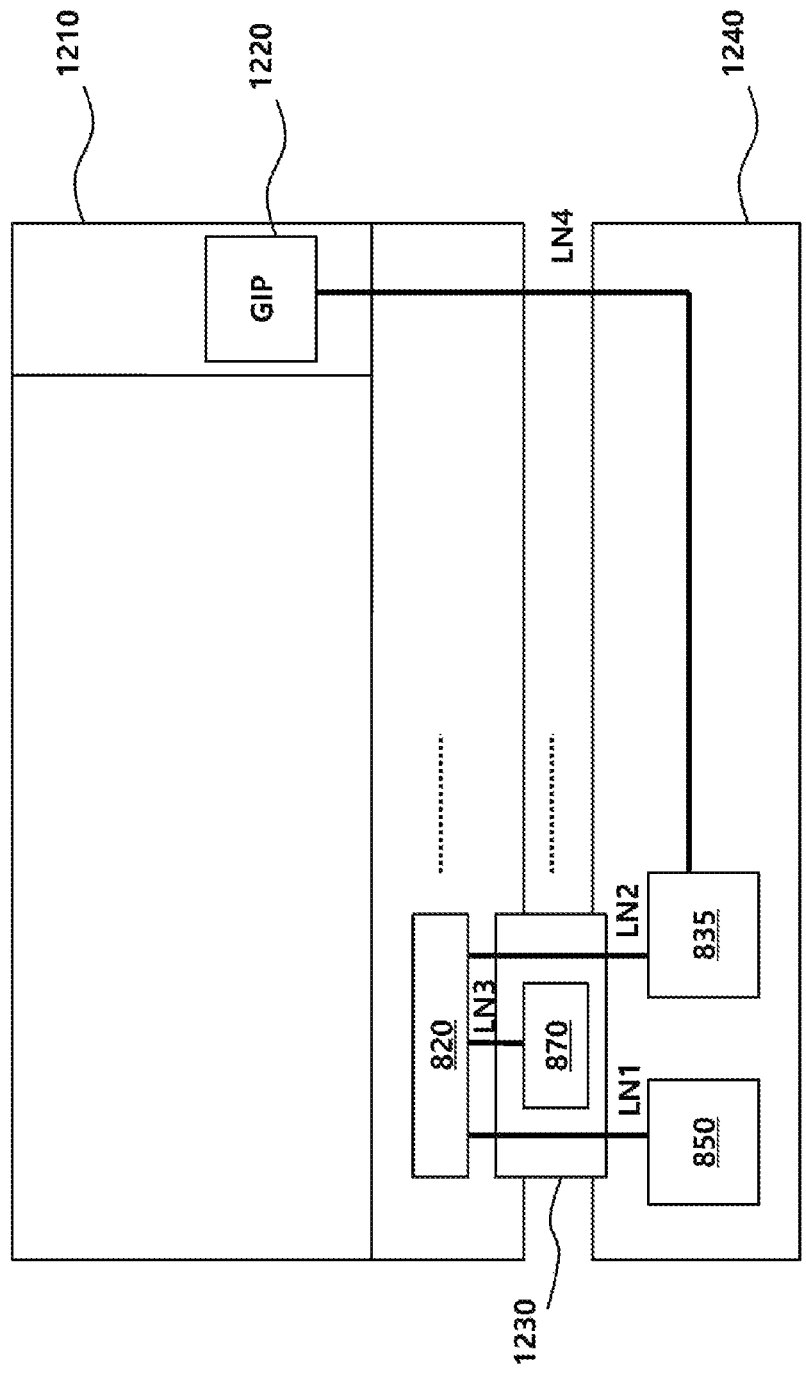
FIG. 12 illustrates a first example of the wiring around the TDDI package according to the first embodiment.

FIG. 12 illustrates a first example of a peripheral wiring of the TDDI package according to the first embodiment.

Referring to FIG. 12, in a panel 1210, a scan signal supply part 1220 may be disposed in a gate-in-panel (GIP) manner and the TDDI package 820 may be disposed in a chip-on-glass (COG) manner.

In the TDDI package 820, a data driving circuit, a sensing circuit, and a reference voltage conversion circuit may be comprised as an integrated circuit. Some elements of the TDDI package 820 may be connected with the timing control circuit 850 through a first line LN1, some other elements are connected with the level shifter 835 through a second line LN2, and further some other elements are connected with the sensing control circuit 870 through a third line LN3.

The timing control circuit 850 and the level shifter 835 may be disposed on a printed circuit board 1240 and in the printed circuit board 1240, two areas which are electrically insulated from each other may be formed. In a first area, the timing control circuit 850 may be disposed and in a second area, the level shifter 835 may be disposed. The first area may be linked with the first ground voltage and the second area may be linked with the second ground voltage.

The TDDI package 820 located on the panel 1210 and the first and the second lines LN1 and LN2 respectively connecting the timing control circuit 850 and the level shifter 835 located on the printed circuit board 1240 may be disposed on a film 1230.

The sensing control circuit 870 may be disposed on the film 1230 and in such a disposition, the first line LN1, the second line LN2, and the third line LN3 are disposed on the film 1230.

Meanwhile, the timing control circuit 850 may transmit reference clock signals to the reference voltage conversion circuit comprised in the TDDI package 820 through the first line LN1. After converting reference voltage of a reference clock signal, the converted reference clock signal may be transmitted from the TDDI package 820 to the level shifter 835 through the second line LN2. Then, the level shifter 835 may convert the reference clock signal to generate a clock signal having a different voltage level and transmit the clock signal to the scan signal supply part 1220 through the fourth line LN4.

Figure 13:
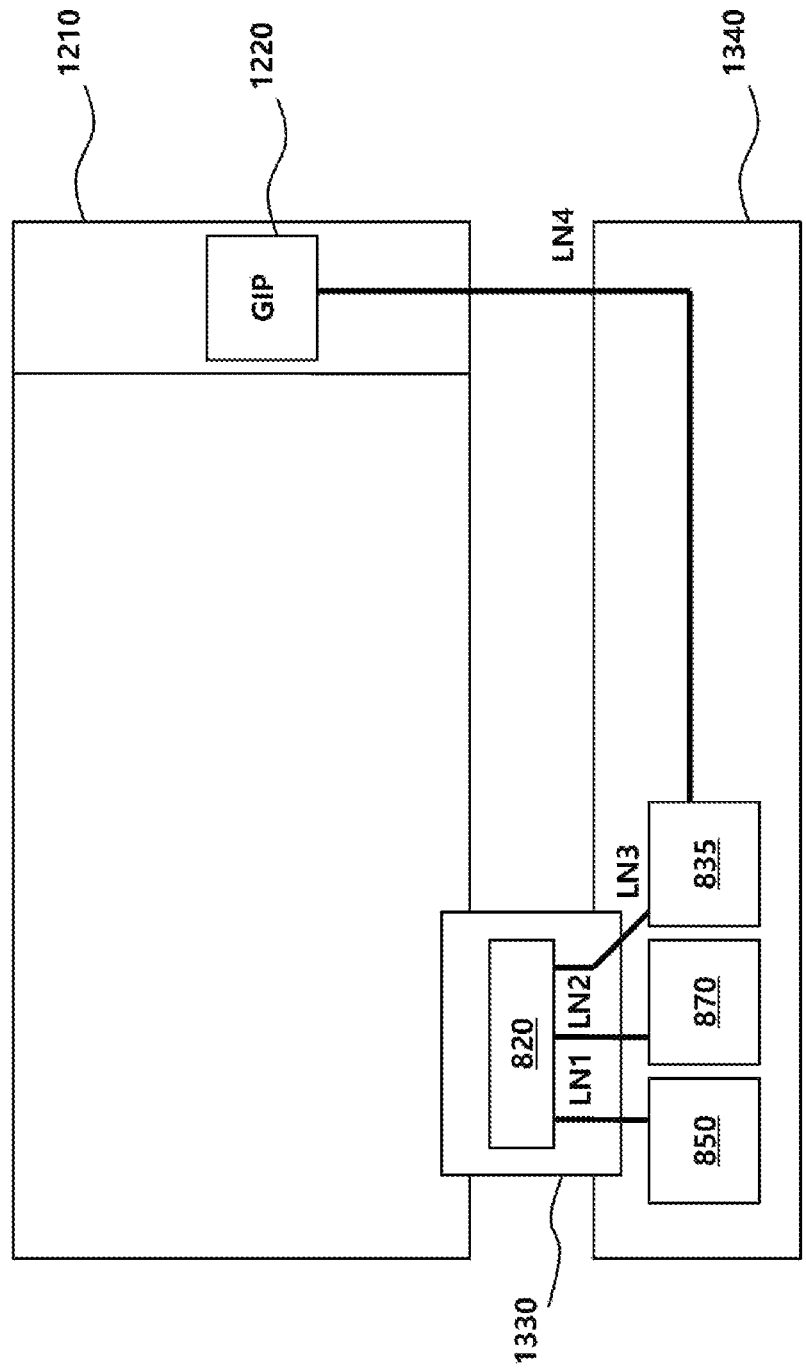
FIG. 13 illustrates a second example of the wiring around the TDDI package according to the first embodiment.

FIG. 13 illustrates a second example of a peripheral wiring of the TDDI package according to the first embodiment.

Referring to the FIG. 13, in the panel 1210, the scan signal supply part 1220 may be disposed in a gate-in-panel (GIP) manner and the TDDI package 820 may be disposed on a film 1330 in a chip-on-film (COF) manner.

In the TDDI package 820, a data driving circuit, a sensing circuit, and a reference voltage conversion circuit may be comprised as an integrated circuit. Some elements of the TDDI package 820 may be connected with the timing control circuit 850 through a first line LN1, some other elements are connected with the level shifter 835 through a second line LN2, and further some other elements are connected with the sensing control circuit 870 through a third line LN3.

The timing control circuit 850, the sensing control circuit 870, and the level shifter 835 may be disposed on a printed circuit board 1340 and in the printed circuit board 1340, two areas which are electrically insulated from each other may be formed. In a first area, the timing control circuit 850 may be disposed and in a second area, the level shifter 835 may be disposed. The first area may be linked with the first ground voltage and the second area may be linked with the second ground voltage.

Meanwhile, the timing control circuit 850 may transmit reference clock signals to the reference voltage conversion circuit comprised in the TDDI package 820 through the first line LN1. After converting reference voltage of a reference clock signal, the converted reference clock signal may be transmitted from the TDDI package 820 to the level shifter 835 through the second line LN2. Then, the level shifter 835 may convert the reference clock signal to generate a clock signal having a different voltage level and transmit the clock signal to the scan signal supply part 1220 through the fourth line LN4.

Meanwhile, the gate driving circuit may be realized in an integrated circuit form which is not divided into a level shifter and a scan signal supply part.

Figure 14:
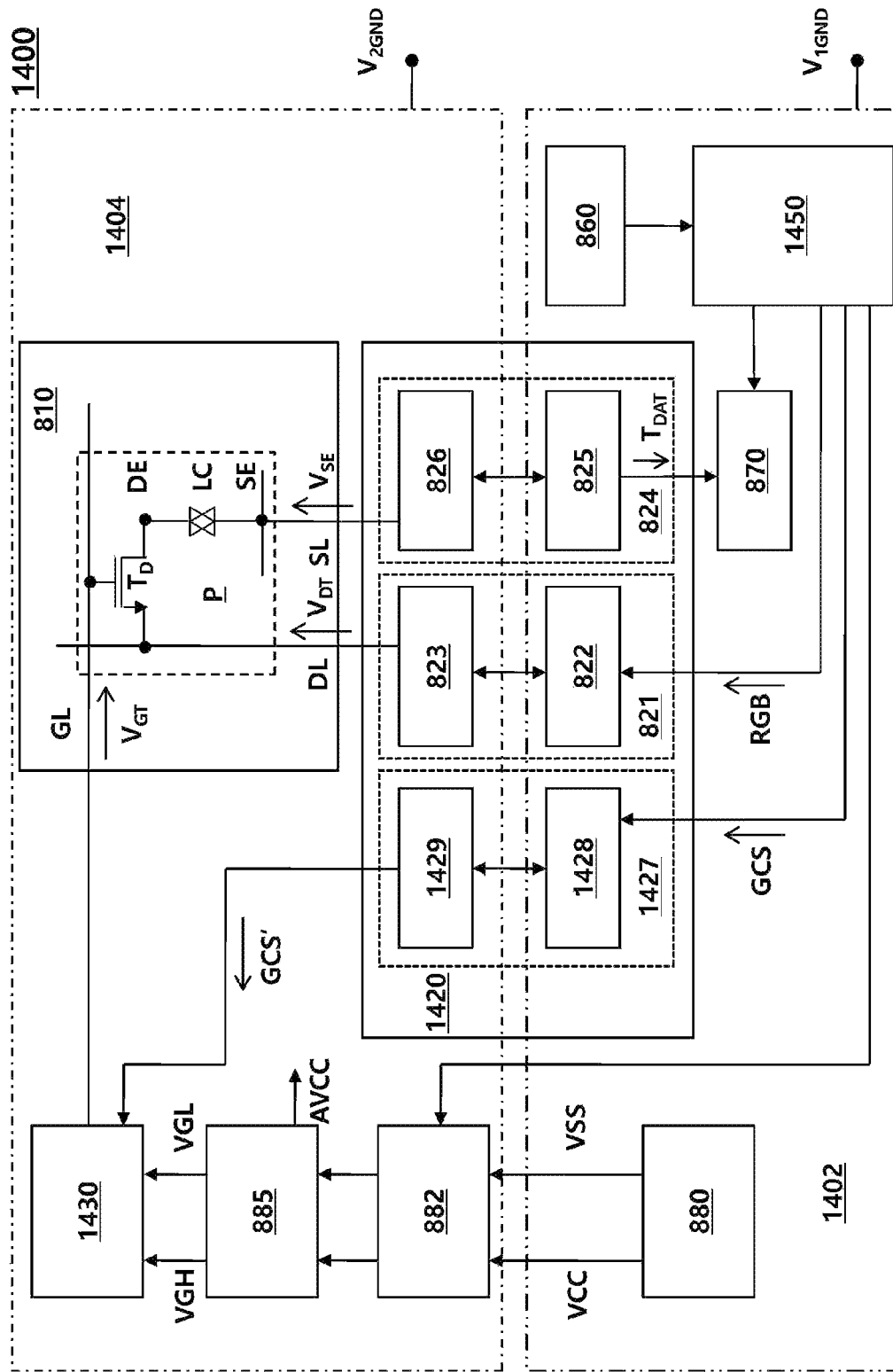
FIG. 14 is a block diagram of a display device according to another embodiment.

FIG. 14 is a block diagram of a display device according to another embodiment.

Referring to FIG. 14, a display device 1400 is divided into two areas 1402 and 1404 and each area 1402 or 1404 may use a ground voltage different from each other as a reference voltage.

A panel 810, a junction circuit 882, a second power management circuit 885, and a gate driving circuit 1430 comprised in the display device 1400 may be disposed in the second are 1404. A host 860, a timing control circuit 1450, a sensing control circuit 870, and a first power management circuit 880 comprised in the display device 1400 may be disposed in the first area 1402. Some elements of a data driving circuit 821, a sensing circuit 824, and a reference voltage conversion circuit 1427 comprised in the display device 1400 may be disposed in the first area 1402 and the other elements may be disposed in the second area 1404. In addition, the data driving circuit 821, the sensing circuit 824, and the reference voltage conversion circuit 1427 may be realized in an integrated circuit as a TDDI package 1420.

The gate driving circuit 1430 may sequentially supply scan signals V$_{GT}$ to each row or each column so that a plurality of pixels P disposed on the panel 810 can be selected by a row or by a column. At this time, the sequence of the scan signals $V_{GT}$ supplied to each row or each column may be determined by a gate control signal GCS supplied from the timing control circuit 1450. The gate control signals GCS may comprise the above-mentioned reference clock signals or clock signals in another form.

The gate control signal GCS is generated with the first ground voltage $V_{1GND}$ as a reference voltage and the reference voltage conversion of the gate control signal GCS may be carried out by a reference voltage conversion circuit 1427. The reference voltage conversion circuit 1427 may convert the reference voltage of a digital signal or a clock signal from the first ground voltage $V_{1GND}$ into the second ground voltage $V_{2GND}$ and a signal to be converted may be a gate control signal GCS.

The reference voltage conversion circuit 1427 may comprise a signal receiving part 1428 and a reference voltage conversion part 1429.

The signal receiving part 1428 may receive signals having the first ground voltage $V_{1GND}$ as a reference voltage, for example, gate control signals GCS.

In addition, regarding signals having the first ground voltage $V_{1GND}$ as a reference voltage, the reference voltage conversion part 1429 may convert the reference voltage of the above-mentioned signals from the first ground voltage $V_{1GND}$ into the second ground voltage $V_{2GND}$ through the reference voltage conversion and transmit the converted signals to the gate driving circuit 1430 located in the second area 1404.

For example, the signal receiving part 1428 may receive the gate control signal GCS from the timing control circuit 1450. The reference voltage conversion part 1429 may convert the reference voltage of the gate control signal GCS from the first ground voltage $V_{1GND}$ into the second ground voltage $V_{2GND}$ and transmit the converted gate control signal GCS' to the gate driving circuit 1430.

As described above, an aspect of the present disclosure allows to increase time for touch driving while maintaining time for display driving. Another aspect of the present disclosure allows to increase time for display driving while maintaining time for touch driving. Another aspect of the present disclosure allows to increase both time for display driving and time for touch driving. Another aspect allows to simultaneously perform display driving and touch driving in some or all intervals.

Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although a preferred embodiment of the present disclosure has been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A panel driving integrated circuit comprising:
    a data driving circuit receiving image data having a first ground voltage as a reference voltage through a first communication, converting the reference voltage of said image data from said first ground voltage into a second ground voltage through a reference voltage conversion, converting said image data into a data signal having said second ground voltage as a reference voltage, and supplying said data signal to a data line; and
    a sensing circuit converting a sensing signal for a sensor electrode into sensing data, converting the reference voltage of said sensing data from said second ground voltage into said first ground voltage through a reference voltage conversion, and transmitting said sensing data through a second communication,
    and a reference voltage conversion circuit converting signals having said first ground voltage as a reference voltage into signals having said second ground voltage as a reference voltage.

2. The panel driving integrated circuit of claim 1, wherein said first communication is a serial communication, said data driving circuit carries out a parallel signal process for said image data RGB received through the serial communication, and the reference voltage conversion for said image data is carried out in said parallel signal process.

3. The panel driving integrated circuit of claim 2, wherein said image data is transmitted as an embedded clock signal where a clock is embedded in the serial communication.

4. The panel driving integrated circuit of claim 1, wherein a first ground pattern where said first ground voltage is formed and a second ground pattern where said second ground voltage is formed are disposed in a package in which said data driving circuit, said sensing circuit, and said reference voltage conversion circuit are built, and said first ground pattern and said second ground pattern maintain an insulation distance over a certain amount from each other.

5. The panel driving integrated circuit of claim 1, wherein said data driving circuit comprises a digital-analog-converter (DAC) for generating said data signal using gamma voltage and said DAC uses said second ground voltage as a reference voltage.

6. The panel driving integrated circuit of claim 1, wherein said reference voltage conversion circuit converts the reference voltage of a digital signal or a clock signal.

7. The panel driving integrated circuit of claim 1, wherein said reference voltage conversion circuit converts a reference clock signal of a scan signal supplied through a gate line from a signal having said first ground voltage as a reference voltage into a signal having said second ground voltage as a reference voltage and transmits the converted signal to a level shifter.

8. The panel driving integrated circuit of claim 7, wherein said level shifter is synchronized with edges of two reference clock signals to generate a plurality of clock signals for generating said scan signals.

9. The panel driving integrated circuit of claim 1, wherein said sensor electrode is used as a common electrode, and the supply of said data signals for said data driving circuit and the sensing of said sensor electrode by said sensing circuit are simultaneously carried out.

10. A display device comprising:
a panel on which pixels are defined by intersections of a plurality of data lines and a plurality of gate lines and sensor electrodes are disposed;
a timing control integrated circuit generating reference clock signals used for driving said gate line;
a panel driving integrated circuit; and
a level shifter,
said panel driving integrated circuit comprising:
a data driving circuit receiving image data having a first ground voltage as a reference voltage from said timing control circuit through a first communication, converting the reference voltage of said image data from said first ground voltage into said second ground voltage through a reference voltage conversion, converting said image data into a data signal having said second ground voltage as a reference voltage, and supplying said signal to said data line;
a sensing circuit converting the sensing signals for said sensor electrodes into the sensing data, converting the reference voltage of said sensing data from said second ground voltage into said first ground voltage through a reference voltage conversion, and transmitting said sensing data through the second communication;
a reference voltage conversion circuit receiving said reference clock signal and converting the reference voltage of said reference clock signal from said first ground voltage into said second ground voltage through the reference voltage conversion; and
said level shifter generating a plurality of clock signals for driving said gate lines by shifting the voltage levels of said reference clock signal.

11. The display device of claim 10 further comprising:
a first power management circuit linked with said first ground voltage; and
a second power management circuit linked with said second ground voltage,
said first power management circuit supplying driving voltage to said timing control integrated circuit,
said second power management circuit supplying driving voltage to said level shifter,
said first power management circuit supplying driving voltage to a part linked with said first ground voltage in said data driving circuit, said sensing circuit, and said reference voltage conversion circuit, and
said second power management circuit supplying driving voltage to a part linked with said second ground voltage in said data driving circuit, said sensing circuit, and said reference voltage conversion circuit.

12. An integrated circuit comprising:
an image data receiving part receiving image data having a first ground voltage as a reference voltage from a timing control circuit through a first communication;
a data signal part converting said image data into a data signal having a second ground voltage as a reference voltage and then supplying said signal to the data line; and
a reference voltage conversion part converting the reference voltage of the reference clock signal received from said timing control circuit from said first ground voltage into said second ground voltage through a reference voltage conversion and transmitting said converted reference clock signals to said level shifter.

13. The integrated circuit of claim 12, wherein two areas electrically insulated from each other are formed in a printed circuit board, said timing control circuit is disposed in a first area and said level shifter is disposed in a second area, and being connected with said timing control circuit through a first line and being connected with said level shifter through a second line.

14. The integrated circuit of claim 12 further comprising:
a sensing part converting a sensing signal for a sensor electrode into sensing data; and
a sensing data transmission part converting the reference voltage of said sensing data from said second ground voltage into said first ground voltage through a reference voltage conversion and transmitting said converted sensing data to a sensing control circuit.

15. The integrated circuit of claim 14, wherein said sensing control circuit is disposed on a film and on said film, a wiring connecting said image data receiving part with said timing control circuit, a wiring connecting said reference voltage conversion part with said level shifter, and a wiring connecting said sensing control circuit with said timing control circuit are disposed.

16. The integrated circuit of claim 14, wherein said data signal part and said sensing part asynchronously operate.

17. The integrated circuit of claim 12, said sensor electrode is a cathode electrode of an organic light emitting diode (OLED) disposed on a pixel.

* * * * *